US009671490B2

United States Patent
Brandl et al.

(10) Patent No.: US 9,671,490 B2
(45) Date of Patent: Jun. 6, 2017

(54) REDUCED STRAY RADIATION OPTOELECTRONIC DEVICE

(71) Applicant: OSRAM Opto Semiconductors GmbH, Regensburg (DE)

(72) Inventors: Stefan Brandl, Regensburg (DE); Hubert Halbritter, Dietfurt (DE)

(73) Assignee: OSRAM Opto Semiconductors GmbH (DE)

( * ) Notice: Subject to any disclaimer, the term of this patent is extended or adjusted under 35 U.S.C. 154(b) by 147 days.

(21) Appl. No.: 14/429,467

(22) PCT Filed: Sep. 19, 2013

(86) PCT No.: PCT/EP2013/069499
§ 371 (c)(1),
(2) Date: Mar. 19, 2015

(87) PCT Pub. No.: WO2014/048832
PCT Pub. Date: Apr. 3, 2014

(65) Prior Publication Data
US 2015/0226839 A1    Aug. 13, 2015

(30) Foreign Application Priority Data
Sep. 27, 2012   (DE) .................... 10 2012 109 183

(51) Int. Cl.
| G01S 7/481 | (2006.01) |
| H01L 25/16 | (2006.01) |
| H01L 31/0232 | (2014.01) |
| H01L 33/58 | (2010.01) |
| G01S 17/02 | (2006.01) |
| H01L 33/48 | (2010.01) |

(52) U.S. Cl.
CPC .......... *G01S 7/4813* (2013.01); *G01S 7/4814* (2013.01); *G01S 7/4816* (2013.01); *G01S 17/026* (2013.01); *H01L 25/167* (2013.01); *H01L 31/0232* (2013.01); *H01L 31/02327* (2013.01); *H01L 33/58* (2013.01); *H01L 33/486* (2013.01); *H01L 2224/48091* (2013.01)

(58) Field of Classification Search
CPC .... G01S 7/4813; G01S 17/026; G01S 7/4816; G01S 7/4814
USPC ........................................................ 250/221
See application file for complete search history.

(56) References Cited

U.S. PATENT DOCUMENTS

| 5,015,831 A | * | 5/1991 | Eastman | ............ G06K 7/10653 235/462.36 |
| 5,198,664 A | | 3/1993 | Fayfield | |

(Continued)

FOREIGN PATENT DOCUMENTS

| DE | 4023341 | 1/1992 |
| EP | 1569276 | 8/2005 |
| EP | 1858086 | 11/2007 |

*Primary Examiner* — Seung C Sohn
(74) *Attorney, Agent, or Firm* — DLA Piper LLP (US)

(57) ABSTRACT

An optoelectronic device includes an optoelectronic component that generates or receives radiation, a frame and an optical element, wherein the frame extends in a vertical direction between a radiation passage side and a rear side; an opening, in which the component is arranged, is formed in the frame; the optical element covers the component in a plan view of the radiation passage side; and the optical element is a Fresnel lens or a Fresnel zone plate.

15 Claims, 2 Drawing Sheets

(56) References Cited

U.S. PATENT DOCUMENTS

| | | | |
|---|---|---|---|
| 6,239,437 B1* | 5/2001 | Barone | G08B 13/193 250/342 |
| 8,957,380 B2* | 2/2015 | Costello | G01S 7/4813 250/338.1 |
| 2004/0245472 A1* | 12/2004 | Barone | G01J 5/08 250/349 |
| 2006/0082891 A1* | 4/2006 | Milner | B60J 1/02 359/642 |
| 2007/0194337 A1 | 8/2007 | Kondo | |
| 2010/0171027 A1* | 7/2010 | Yun | H03K 17/941 250/221 |
| 2010/0219330 A1 | 9/2010 | Klein et al. | |
| 2011/0057104 A1* | 3/2011 | Yao | G01J 1/32 250/338.1 |
| 2011/0057129 A1* | 3/2011 | Yao | G01S 7/4813 250/552 |
| 2011/0297831 A1 | 12/2011 | Yao et al. | |

* cited by examiner

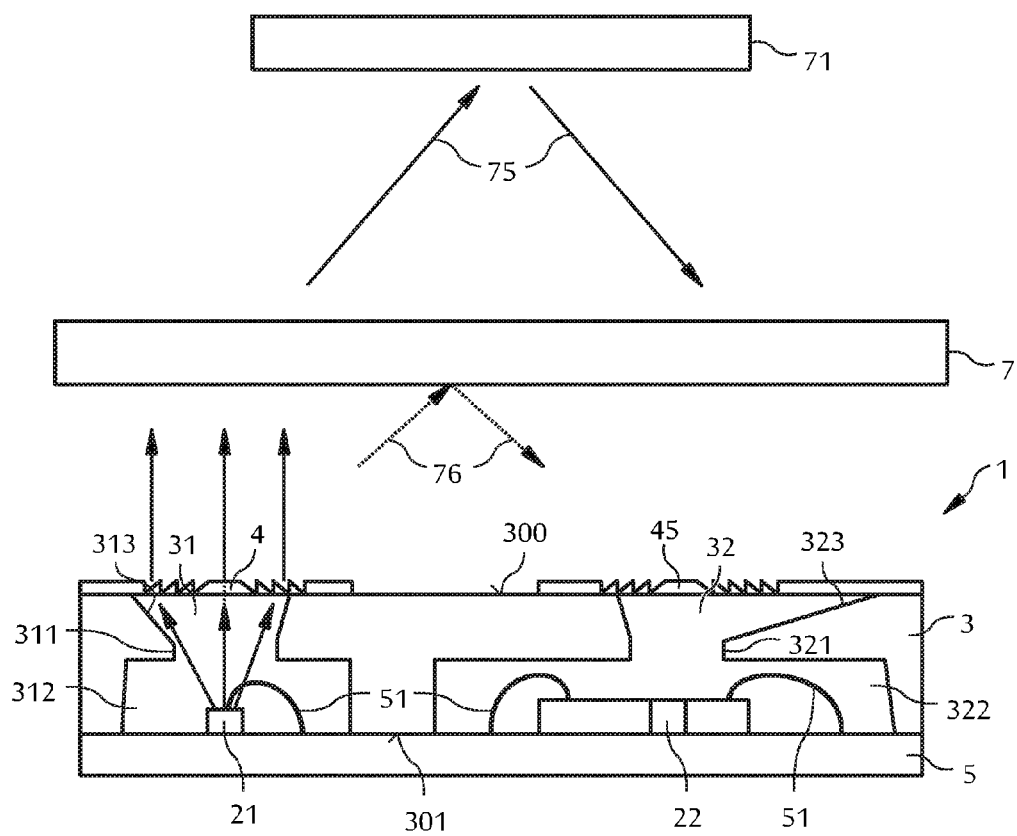

REDUCED STRAY RADIATION OPTOELECTRONIC DEVICE

TECHNICAL FIELD

This disclosure relates to an optoelectronic device comprising at least one optoelectronic component.

BACKGROUND

In proximity sensors, particularly for applications with comparatively long distances from the target object, only a small portion of the emitted radiation is typically reflected back from a target object and detected. Moreover, stray radiation supplies an unwanted signal portion.

It could therefore be helpful to provide an optoelectronic device with a reduced stray radiation portion.

SUMMARY

We provide an optoelectronic device including an optoelectronic component that generates or receives radiation, a frame and an optical element, wherein the frame extends in a vertical direction between a radiation passage side and a rear side; an opening, in which the component is arranged, is formed in the frame; the optical element covers the component in a plan view of the radiation passage side; and the optical element is a Fresnel lens or as a Fresnel zone plate.

We further provide an optoelectronic device including an optoelectronic component that generates or receives radiation, a frame and an optical element, wherein the frame extends in a vertical direction between a radiation passage side and a rear side; an opening in which the component is arranged is formed in the frame; the optical element covers the component in a plan view of the radiation passage side; the optical element is a Fresnel lens or as a Fresnel zone plate; the opening has an edge at which a cross section of the opening increases at least in regions; and the optical element is arranged between the rear side and the edge.

BRIEF DESCRIPTION OF THE DRAWINGS

FIG. 1 shows a first example of an optoelectronic device in a schematic sectional view.

DETAILED DESCRIPTION

Figure 2A:
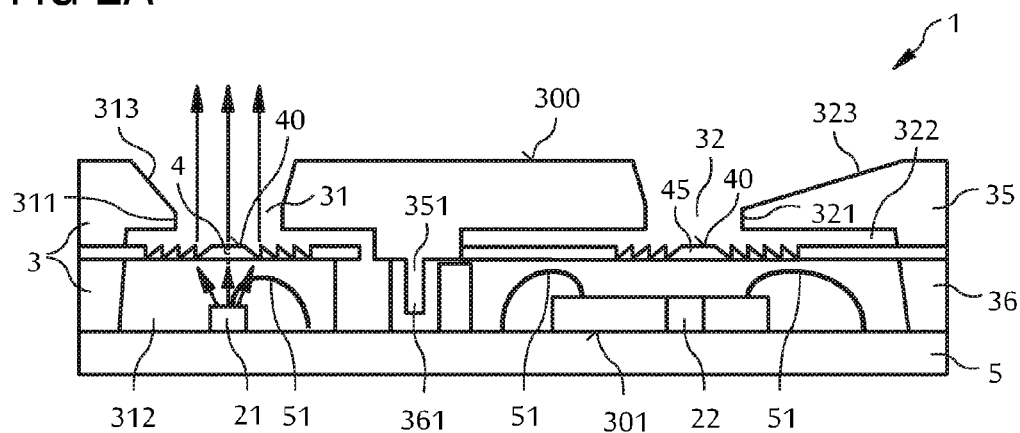
FIG. 2A shows a second example of an optoelectronic device in a schematic sectional view.

Our optoelectronic device may include an optoelectronic component provided to receive or generate radiation. The device can also include more than one optoelectronic component. By way of example, the optoelectronic component can be provided to generate radiation and a further optoelectronic component can be provided to receive radiation, or vice versa. By way of example, the optoelectronic component and the further optoelectronic component can form an emitter/detector pair. By way of example, a component provided to generate radiation can be a luminescent diode, for example, a light-emitting diode or a laser diode. By way of example, an optoelectronic component provided to receive radiation can be a photodiode, a phototransistor or an application specific integrated circuit (ASIC) comprising a photosensitive region. By way of example, the optoelectronic component and/or, optionally, the further component can be an unpackaged semiconductor chip. That is to say, the component itself does not include a housing in which the semiconductor chip is arranged.

The device may include a frame. The frame extends in the vertical direction between a radiation passage side and a rear side. By way of example, the frame can be a plastic molded body. Furthermore, the frame can be absorbent, at least in some regions, for the radiation to be generated and/or received by the optoelectronic component. By way of example, the frame can be manufactured from a material absorbing the radiation or can be coated with such an absorbing material. The frame preferably absorbs at least 60% of the incident radiation, particularly preferably at least 80%, at least in places.

An opening in which the component is arranged may be formed in the frame. In the vertical direction, the opening can extend completely through the frame. In the lateral direction, that is to say perpendicularly to the vertical direction, the opening preferably completely extends around the component. More than one opening can also be formed in the frame. By way of example, two openings can be provided. The openings are preferably at a distance from one another in the lateral direction. By way of example, the component can be arranged in the opening and the further component can be arranged in the further opening. The frame optically separates the component and the further component from one another. Thus, there is no direct beam path between the component and the further component.

The device may include an optical element. The optical element can be a pre-manufactured element which, for example, is fastened to the frame.

The optical element may be a Fresnel lens or a Fresnel zone plate. A Fresnel lens is also referred to as a stepped lens. Compared to a spherical lens with the same focal length, a Fresnel lens is distinguished by a reduced thickness. A Fresnel zone plate is also referred to as a zone plate. A Fresnel zone plate is distinguished, in particular, by a plurality of regions with different radiation transmittances, wherein the regions are preferably arranged concentrically.

The optical element may cover the component in a plan view of the radiation passage side. In particular, the optical element can have a larger cross section in the lateral direction than a closest region of the frame on one side of the optical element. In other words, the optical element completely covers the closest region of the frame.

The device may include an optoelectronic component provided to generate or receive radiation, a frame and an optical element, wherein the frame extends in a vertical direction between a radiation passage side and a rear side. An opening in which the component is arranged is formed in the frame. The optical element covers the component in a plan view of the radiation passage side. The optical element is embodied as a Fresnel lens or as a Fresnel zone plate.

The optical element may be a film. Thus, the optical element can be a pre-manufactured, flexible element. The film preferably contains a plastic or consists of a plastic. By way of example, a polyimide is a suitable plastic material for the film. Furthermore, the film may, for example, be a self-adhesive film. By using the film, the installation height of the device may be reduced further. As an alternative to a flexible film, use can be made of e.g. a rigid platelet in which the optical element is formed.

The Fresnel lens or the Fresnel zone plate can be formed in the film. A Fresnel lens can be formed, for example, by a printing method or an embossing method. For a Fresnel zone plate, the film can be provided with a radiation-opaque coating in regions to produce radiation-opaque zones. Alternatively, the radiation-opaque regions can also be formed in the film itself. The described methods are also suitable when using a rigid platelet.

The optical element may be arranged on the radiation passage side of the frame. The optical element can complete the device in the vertical direction. That is to say, no further element of the device is arranged on the side of the optical element facing away from the frame.

The optical element may be arranged between the radiation passage side and the rear side of the frame, in particular between the radiation passage side and the component, in the vertical direction. In other words, the optical element, in particular a front side of the optical element facing away from the component, is closer to the component than the radiation passage side of the frame in the vertical direction.

The frame may include a first frame part and a second frame part. In particular, the frame can be made up of a number of pieces. That is to say, the first frame part and the second frame part can be manufactured separately from one another. However, deviating from this, the frame can also be formed in one piece.

The first and second frame parts are preferably arranged above one another in the vertical direction. By way of example, the first frame part can form the radiation passage side of the frame and the second frame part can form the rear side of the frame.

The optical element may be arranged between the first and second frame parts. The first and second frame parts can be manufactured from the same material or from materials that differ from one another. Together, the first and the second frame parts preferably form the opening and, optionally, the further opening of the frame. Thus, the opening extends both through the first frame part and through the second frame part, in particular completely.

The first and second frame parts can each include at least one connection element, wherein the connection elements engage one another. By way of example, the one connection element can be a recess or a cutout and the other connection element can be a protrusion, for example, a pin which is insertable into the recess or cutout.

The opening may include an undercut region between the radiation passage side and the rear side. As seen from the radiation passage side, the cross section of the opening therefore increases at least along one lateral direction. By way of example, the opening can have an edge, at which the cross section of the opening increases, at least in regions.

The opening may have a smaller cross-sectional area on the radiation passage side than on the rear side. As the cross-sectional area on the rear side of the frame increases, more space is available to mount the component in the opening.

The device may include a connection support connected to the rear side of the frame. The optoelectronic component and, optionally, the further optoelectronic component can be mounted on the connection support. By way of example, the connection support can be a printed circuit board. Alternatively, it is also possible to embody the connection support as a lead frame.

In the lateral direction, the frame can terminate flush with the connection support, at least in regions. In particular, the frame can terminate flush with the connection support along the whole circumference of the device. During production of the device, the connection support and the frame can be severed in a common manufacturing step.

The device may be surface-mountable. This means that the device is a surface-mountable component (surface mounted device, SMD). By way of example, on the side facing away from the frame, the connection support includes electrical contacts for the external electrical contacting.

The device may include a further optoelectronic component. The further optoelectronic component can be arranged in a further opening of the frame. The opening and the further opening are preferably at a distance from one another in the lateral direction.

The device may include a further optical element which covers the further component in a plan view of the radiation passage side. In particular, the further optical element can be a Fresnel lens or a Fresnel zone plate. Thus, respectively separate optical elements are assigned to the component and the further component. The optical element and the further optical element are preferably at a distance from one another in the lateral direction.

The device may be a proximity sensor. The component and the further component can form an emitter/detector pair. By way of example, the proximity sensor can be provided for operation in a handheld instrument, for example, a cellular telephone or a mobile data processing instrument.

Further features and functionalities emerge from the following description of the examples in conjunction with the figures.

The same, similar or similarly acting elements have been provided with the same reference signs in the figures.

The figures and the dimensional relationships of the elements in relation to one another, depicted in the figures, should not be considered true to scale. Rather, individual elements can be depicted with an exaggerated scale for better reproducibility and/or for better understanding.

A first example of an optoelectronic device 1 is depicted in a schematic sectional view in FIG. 1. The optoelectronic device 1 includes a component 21 that generates radiation and a further component 22 that receives radiation. By way of example, the component 21 embodied as an emitter can be a luminescent diode, for example, a light-emitting diode or a laser diode. The component 21 preferably emits radiation in the near infrared (NIR, vacuum wavelength 750 nm to 1400 nm), particularly preferably in the wavelength range of 800 nm to 1000 nm.

By way of example, a photodiode, a phototransistor or an application specific integrated circuit comprising a photosensitive region is particularly suitable for the further component 22 embodied as a detector.

The components 21, 22 are arranged on a connection support 5 and connected to the latter in an electrically conductive manner. By way of example, a circuit board, for example, a printed circuit board (PCB) is suitable as a connection support 5. Alternatively, use can also be made of a lead frame.

By way of example, the electrically conductive connection can be brought about, at least in part, by connection lines 51, for example, bond wires. In particular, the components 21, 22 can respectively be unpackaged components. As a result, the spatial requirements are reduced compared to components which themselves include a housing. However, use can also be made of components which themselves include a housing, for example, surface mountable components.

A frame 3 is arranged on the connection support 5. The frame extends in the vertical direction, i.e. perpendicular to a plane of main extent of the connection support 5, between a radiation passage side 300 facing away from the connection support 5 and a rear side 301 facing the connection support. By way of example, the frame 3 can be fastened to the connection support 5 by a connection layer, for example, an adhesive layer (not explicitly shown).

In the lateral direction, the frame 3 and the connection support 5 terminate flush with one another, at least in regions and preferably along the whole circumference. The devices can thus be manufactured in a simpler manner as a composite during the production, wherein, for the purposes of separating the composite into the individual optoelectronic devices, the frames 3 and the connection supports 5 can be severed in a common separation step. The frame 3 includes an opening 31 and a further opening 32 in which the component 21 and the further component 22, respectively, are arranged. In the vertical direction, the openings in each case extend completely through the frame 3.

An optical element 4 and a further optical element 45 are arranged on the side of the frame 3 facing away from the connection support 5. In a plan view of the device, the optical element 4 covers the component 21 and the further optical element 45 covers the further component 22. In the shown example, the optical elements 4, 45 completely cover the openings 31 and 32, respectively, such that the optical elements also fulfill the function of a cover.

The components 21, 22 are arranged in the openings 31, 32, respectively free from an encapsulation element, for example, in the form of a transparent potting compound. A beam path between the components 21, 22 and the associated, in particular pre-manufactured optical element 4 is therefore free from a potting material for the component 21 or the further component 22. The optical elements 4, 45 respectively fulfill the function of a protective cover, for example, against mechanical loads or dust.

The optical elements 4, 45 are respectively a Fresnel lens. By the Fresnel lens arranged over the component 21 embodied as an emitter, radiation emitted during operation of the optoelectronic device may be collimated. During operation of the optoelectronic device 1 in an apparatus, for example, in a handheld communication instrument such as a cellular telephone or a mobile computer, the radiation emitted by the component 21 is emitted through a radiation window 7, behind which the optoelectronic device is arranged, and reflected at a target object 71. This target radiation 75, depicted by arrows, is received by the further component 22 embodied as a detector.

What can be achieved by the optical elements embodied as Fresnel lenses is that a greater portion of the target radiation is incident on the further component 22 in the case of the same radiation power of the component 21. By contrast, the portion of the stray radiation 76 which does not originate from a target object but rather from an optical crosstalk within the apparatus, for example, by reflection at the radiation window 7, is not increased or at least not increased substantially. Thus, the portion of the whole signal caused by stray radiation 76 is reduced. As a result, the range of the optoelectronic device 1 embodied as a proximity sensor can be increased for the same power intake. Alternatively, the same range can be obtained with a reduced power intake of the device.

We found that a Fresnel lens is particularly suitable to increase the portion of the desired target radiation relative to the stray radiation. In particular, a Fresnel lens can be positioned at a very short distance from the component 21. As the distance between the component and the optical element 4 decreases, the radiation portion which is emitted by the component and incident on the optical element without prior reflection at the frame 3 can increase. A conventional spherical lens which has a sufficiently short focal length for close positioning to the component 21 would, by contrast, be comparatively thick. Thus, on account of the flat structure of a Fresnel lens, it is possible, overall, to achieve a particularly flat structure for the optoelectronic device while at the same time having good emission and detection properties.

Furthermore, the structure of a Fresnel lens can in a simple manner be transferred onto a film, for example, by a printing or embossing method. The function of an optical element can thus be integrated in a simple manner into a film acting as a cover.

Figure 2B:
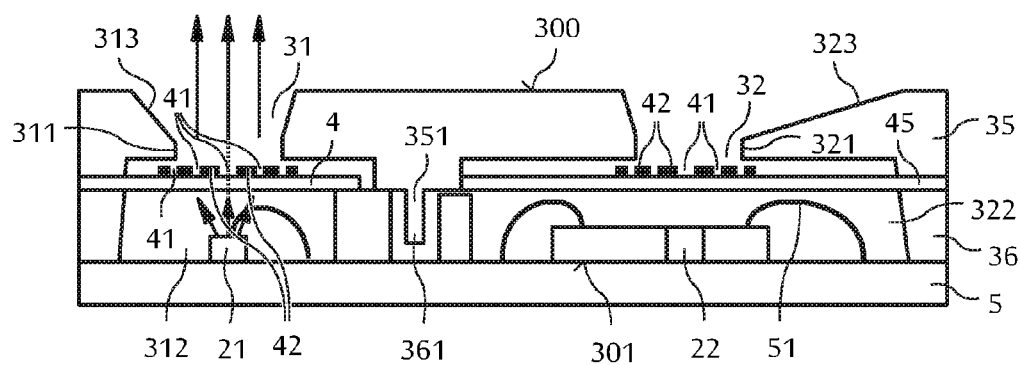
FIG. 2B shows a third example of an optoelectronic device in a schematic sectional view.

As an alternative to a Fresnel lens it is also possible, as described in more detail in conjunction with FIG. 2B, to make use of a Fresnel zone plate. A compact structure can also be obtained with such a zone plate.

By way of example, a polyimide film, in particular a self-adhesive polyimide film, is suitable as a film. By way of example, a suitable film is distributed by the manufacturer DuPont under the trade name "Kapton". However, instead of a film, use can also be made, for example, of a rigid platelet in which the optical element is embodied.

The frame 3 preferably absorbs the radiation generated by the component 21 in a targeted manner. Preferably at least 60%, particularly preferably at least 80% of the radiation incident on the frame 3 is absorbed. As the absorption increases, the risk of radiation reflected at the frame being incident on the further component 22 after multiple reflections decreases, wherein an increased proportion of the reflected radiation originates from unwanted stray radiation.

By way of example, the frame 3 can be manufactured as a plastic molded body, in particular from a black plastic. Alternatively, the frame 3 can also be coated, at least in regions, by a radiation-absorbing material, for example, a black material. By way of example, an injection molding method or a transfer molding method is suitable to produce the frame 3.

Furthermore, the opening 31 and the further opening 32 include an undercut region 312 and an undercut region 322, respectively. In the undercut region, the cross-sectional area of the openings 31 and 32 is greater than in part of the frame 3 situated further away from the rear side 301. As a result of the undercut regions, the space available to assemble the components 21, 22 is enlarged. In a plan view of the device 1, the frame at least partly covers the connection lines 51. In the vertical direction, the undercut region 312 of the opening 31 extends between an edge 311 and the rear side 301. Accordingly, the undercut region 322 of the further opening 32 extends between an edge 321 and the rear side 301.

At the edges 311, 321, the cross section of the openings 31, 32 preferably increases discontinuously in the direction of the connection support 5.

Between the radiation passage side 300 and the edge 311, and between the radiation passage side and the edge 321, the openings 31, 32, respectively, include an obliquely extending region 313 and 323, respectively. That is to say, the regions do not extend parallel and do not extend perpendicular to the vertical direction. In particular, the incline of the obliquely extending region 313 is so large, at least on the side further away from the further component 22, that radiation emitted by the component 21 cannot impinge directly on the obliquely extending region 313, i.e. without a preceding reflection. We found that this radiation portion predominantly increases the stray radiation portion.

Accordingly, the obliquely extending region 323 of the further opening 32 is arranged so obliquely on the side further away from the component 21 that radiation incident on this region and diffusely reflected under any angle cannot impinge directly, i.e. without further reflection, on the photosensitive region of the further component 22. The portion of stray radiation can thus be further reduced.

The optoelectronic device 1 is preferably a surface mountable component. For the purposes of electrical contacting, the connection support 5, on the side facing away from the frame 3, preferably includes electrical contacts for external electrical contacting (not explicitly depicted).

Deviating from the described example, it is also possible that an optical element is only assigned to the component 21 or the further component 22. Furthermore, the optoelectronic device can also include only one component with an associated optical element. In general, the described example is suitable for optoelectronic devices with a compact design in which radiation is intended to be emitted efficiently in the vertical direction or in which radiation is intended to be detected predominantly from a direction which extends parallel to the vertical direction.

A second example for an optoelectronic device is depicted schematically in FIG. 2A in a sectional view. This second example substantially corresponds to the first example described in conjunction with FIG. 1.

In contrast thereto, the optical elements 4, 45 are respectively arranged between the radiation passage side 300 and the rear side 301 of the frame. A front side 40 of the optical elements 4, 45 facing away from the rear side of the frame is therefore arranged closer to the rear side of the frame than the radiation passage side 300 of the frame.

The frame has a multi-part, in particular a two-part design. The frame 3 comprises a first frame part 35 and a second frame part 36, wherein the first frame part 35 forms the radiation passage side 300 and the second frame part 36 forms the rear side 301 of the frame.

The optical element 4 and the further optical element 45 are respectively arranged in regions between the first frame part 35 and the second frame part 36. In particular, the optical elements 4, 45 are respectively arranged between the rear side 301 and the edge 311 of the opening 31, and between the rear side 301 and the edge 321 of the further opening 32.

Using the described examples, the optical elements can be positioned closer to the respectively assigned component. In the case of the component 21 embodied as an emitter, it is thus possible to maximize the portion of radiation emerging from the optoelectronic device 1 without a prior reflection at the frame 3. In the case of the further component 22 embodied as a detector, the further opening 32, in particular the edge 321, can form an aperture disposed upstream of the further optical element 45 from the view of the incident radiation.

The optical elements 4, 45, respectively, have a larger cross section than the openings 31, 32 in the region of the second frame part, and so the optical elements satisfy the functionality of a cover for the components 21, 22. Additionally, the frame parts 35, 36 can fix the optical elements.

For simplified mechanical assembly and positioning of the first frame part 35 relative to the second frame part 36, the frame parts respectively include a connection element 351 and 361, respectively. In the shown example, the connection element 351 is a continuation of the first frame part 35 which is insertable into a recess of the second frame part 36. The number and geometric design of the connection elements are variable within wide limits.

The first frame part 35 and the second frame part 36 can respectively be manufactured from the same material. Deviating from this, it is also feasible to provide mutually different materials or mutually different coatings for the two frame parts.

A third example of an optoelectronic device is depicted schematically in FIG. 2B in a sectional view. This third example substantially corresponds to the second example described in conjunction with FIG. 2A. In contrast thereto, the optical element 4 and the further optical element 45 are respectively embodied as a Fresnel zone plate. The Fresnel zone plate includes a plurality of radiation-transmissive regions 41 and a plurality of radiation-opaque regions 42. The radiation-transmissive regions 41 and the radiation-opaque regions 42 are arranged in an alternating sequence, preferably in a concentric manner.

Deviating from the described example, the optical element 4 can be a Fresnel lens and the further optical element 45 can be a Fresnel zone plate, or vice versa. Furthermore, such a Fresnel zone plate can also find use in the first example described in conjunction with FIG. 1.

Our devices are not restricted by the description on the basis of the examples. Rather, the disclosure comprises each novel feature and each combination of features which, in particular, contains each combination of features in the appended claims, even if the feature or combination itself is not explicitly specified in the claims or in the examples.

The invention claimed is:

1. An optoelectronic device comprising an optoelectronic component that generates or receives radiation, a frame and an optical element, wherein the frame extends in a vertical direction between a radiation passage side and a rear side; an opening in which the component is arranged is formed in the frame; the optical element covers the component in a plan view of the radiation passage side; the optical element is a Fresnel lens or a Fresnel zone plate; the opening has an edge at which a cross section of the opening increases at least in regions; and the optical element is arranged between the rear side and the edge.

2. The device according to claim 1, wherein the optical element is a film in which the Fresnel lens or the Fresnel zone plate is formed.

3. The device according to claim 1, wherein the optical element is a pre-manufactured element fastened to the frame.

4. The device according to claim 1, wherein the optical element is arranged between the radiation passage side and the component in the vertical direction.

5. The device according to claim 1, wherein a front side of the optical element facing away from the component is arranged closer to the component than the radiation passage side of the frame.

6. The device according to claim 1, wherein the frame includes a first frame part and a second, separate frame part and the first frame part and the second frame part are arranged above one another in the vertical direction.

7. The device according to claim 6, wherein the optical element is arranged between the first frame part and the second frame part.

8. The device according to claim 6, wherein the first frame part and the second frame part each include at least one connection element and the connection elements engage in one another.

9. The device according to claim 1, wherein the optical element is arranged on the radiation passage side of the frame.

10. The device according to claim 1, wherein the opening includes an undercut region between the radiation passage side and the rear side.

11. The device according to claim 1, wherein the opening has a smaller cross-sectional area on the radiation passage side than on the rear side.

12. The device according to claim 1, further comprising a connection support, connected to the rear side of the frame and on which the component is mounted, and wherein the device is a surface-mountable component.

13. The device according to claim 1, further comprising another optoelectronic component arranged in another opening of the frame.

14. The device according to claim 13, further comprising another optical element that covers the another optoelectronic component in a plan view of the radiation passage side, and the another optical element is a Fresnel lens or a Fresnel zone plate.

15. The device according to claim 13, wherein the device is a proximity sensor, in which the component and the further component form an emitter/detector pair.

* * * * *